(12) United States Patent
Kim et al.

(10) Patent No.: US 10,256,438 B2
(45) Date of Patent: Apr. 9, 2019

(54) ORGANIC LIGHT-EMITTING DISPLAY DEVICE

(71) Applicant: LG Display Co., Ltd., Seoul (KR)

(72) Inventors: Kwanghyun Kim, Daegu (KR); JinHo Park, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/338,869

(22) Filed: Oct. 31, 2016

(65) Prior Publication Data

US 2017/0125736 A1 May 4, 2017

(30) Foreign Application Priority Data

Oct. 31, 2015 (KR) .................. 10-2015-0152835

(51) Int. Cl.
*H01L 51/50* (2006.01)
*H01L 51/52* (2006.01)

(52) U.S. Cl.
CPC ...... *H01L 51/5265* (2013.01); *H01L 51/5036* (2013.01); *H01L 51/5056* (2013.01); *H01L 51/5072* (2013.01); *H01L 51/5088* (2013.01); *H01L 51/5218* (2013.01); *H01L 51/5234* (2013.01); *H01L 51/5253* (2013.01); *H01L 2251/558* (2013.01)

(58) Field of Classification Search
CPC .................. H01L 51/5036; H01L 51/5265
USPC .............. 257/40, E51.022, E51.018
See application file for complete search history.

(56) References Cited

U.S. PATENT DOCUMENTS

| 2007/0228367 | A1* | 10/2007 | Nakamura | .......... H01L 51/5265 257/40 |
| 2011/0198629 | A1* | 8/2011 | Lee | ....... H01L 27/3213 257/89 |
| 2014/0027732 | A1* | 1/2014 | Pyo | ........ H01L 51/506 257/40 |
| 2015/0090972 | A1* | 4/2015 | Lee | ...... H01L 27/3211 257/40 |

* cited by examiner

*Primary Examiner* — Robert T Huber
(74) *Attorney, Agent, or Firm* — Fenwick & West LLP (57) ABSTRACT

An organic light-emitting display (OLED) device is disclosed that includes: a red organic light-emitting diode comprising a red organic emission layer; a green organic light-emitting diode comprising a green organic emission layer; and a blue organic light-emitting diode comprising a blue organic emission layer. The difference between a peak of a photoluminescence spectrum of the red organic emission layer and a peak of an electroluminescence spectrum of the red organic light-emitting diode is less than 2 nm, the difference between a peak of a PL spectrum of the green organic emission layer and a peak of an EL spectrum of the green organic light-emitting diode is less than 2 nm, and the difference between a peak of a PL spectrum of the blue organic emission layer and a peak of an EL spectrum of the blue organic light-emitting diode is 4 nm or greater.

19 Claims, 9 Drawing Sheets

|  | COMPARATIVE EXAMPLE | | EMBODYMENT | |
|---|---|---|---|---|
| color | u'v' | Δu'v' | u'v' | Δu'v' |
| Red | 0.510, 0.523 | 0.044 | 0.510, 0.523 | 0.044 |
| Green | 0.090, 0.582 | 0.012 | 0.090, 0.582 | 0.012 |
| Blue | 0.166, 0.168 | 0.021 | 0.164, 0.153 | 0.051 |
| White | 0.195, 0.462 | 0.038 | 0.195, 0.462 | 0.025 |

FIG. 9

ORGANIC LIGHT-EMITTING DISPLAY DEVICE

CROSS-REFERENCE TO RELATED APPLICATIONS

This application claims priority to Korean Patent Application No. 10-2015-0152835 filed on Oct. 31, 2015, in the Korean Intellectual Property Office, the disclosure of which is incorporated herein by reference in its entirety.

BACKGROUND

Technical Field

The present disclosure relates to an organic light-emitting display (OLED) device capable of reducing the color viewing angle distance of white light by increasing the color viewing angle distance of a blue pixel among three primary color pixels of an organic light-emitting display (OLED) device.

Description of the Related Art

Recently, display devices having high luminous efficiency, high brightness, wide viewing angle and fast response speed, are attracting attention. Among a variety of display devices, a liquid-crystal display (LCD) device has been widely used so far. However, a LCD device requires a backlight as an additional light source and has brightness, contrast, viewing angle, etc., which are technically limited.

Recently, an organic light-emitting display (OLED) device has been developed which is self-luminous and thus does not require any additional light source, and has relatively good brightness, contrast and viewing angle.

Each of the sub-pixels of an OLED device includes an organic light-emitting diode, a thin-film transistor for driving the organic light-emitting diode, and a capacitor for storing image signal. The sub-pixels of the OLED device are arranged in a matrix and are configured to display images.

Sub-pixels of an OLED device may include red sub-pixels, green sub-pixels, and blue sub-pixels that can represent three primary colors.

A red sub-pixel includes a red organic light-emitting diode, a driving transistor for driving the red organic light-emitting diode, and a capacitor. A green sub-pixel includes a green organic light-emitting diode, a driving transistor for driving the green organic light-emitting diode, and a capacitor. A blue sub-pixel includes a blue organic light-emitting diode, a driving transistor for driving the blue organic light-emitting diode, and a capacitor.

A red organic light-emitting diode includes a first anode electrode, a red organic emission layer, a cathode electrode and a capping layer. A green organic light-emitting diode includes a second anode electrode, a green organic emission layer, a cathode electrode and a capping layer. A blue organic light-emitting diode includes a third anode electrode, a blue organic emission layer, a cathode electrode and a capping layer.

Organic light-emitting diodes are very vulnerable to oxygen, hydrogen and moisture. Accordingly, organic light-emitting diodes are sealed with an encapsulation layer that can protect the organic light-emitting diodes from oxygen, hydrogen and moisture.

SUMMARY

In order to increase color purity of an organic light-emitting diode and brightness at the front viewing angle, a micro-cavity is created by forming a reflective anode electrode and a transflective cathode electrode. A micro-cavity refers to a structure that can increase the brightness of a particular visible wavelength band (as a result of constructive interference) while decreasing the brightness of other visible wavelength bands (as a result of destructive interference) by adjusting the distance between a reflective electrode (anode electrode) and a transflective electrode (cathode electrode).

The reflective property of the anode electrode can be achieved by using a metal material having high reflectivity in the visible wavelength band, such as silver (Ag) or APC.

The transflective property of the cathode electrode can be achieved by using a metal material that can be transflective with a transmittance from about 35% to 45% in visible wavelength band when it is made as a thin film (e.g., an alloy of magnesium and silver (Mg:Ag) having a thickness of about 150 Å to 250 Å).

However, an organic light-emitting diode having a micro-cavity structure has a color viewing angle distance ($\Delta u'v'$) according to viewing angles. The color viewing angle distance refers to a distance between color coordinates (u'v') measured at different angles such as 0°, 10°, 20°, 30°, 40°, 50°, 60°, 70°, 80° or 90° in the CIELu'v' color space.

For example, color coordinates measured at the viewing angle of 0° may be defined as u'v'@0°. In addition, color coordinates measured at the viewing angle of 60° may be defined as u'v'@60°. In addition, the distance between the color coordinates u'v'@0° and the color coordinates u'v'@60° may be defined as $\Delta u'v'$@0° to 60°.

The color coordinates of white light (white u'v') of an OLED device having a micro-cavity can vary depending on color coordinates of red light (red u'v'), color coordinates of green light (green u'v') and color coordinates of blue light (blue u'v'). In addition, the color coordinates of red light (red u'v'), the color coordinates of green light (green u'v'), and the color coordinates of blue light (blue u'v') vary differently depending on viewing angles.

Furthermore, viewers (or users) are more sensitive to change in the color coordinates of white light than change in color coordinates of light of one of three primary colors.

In view of the above, an aspect of the present disclosure is to provide an OLED device capable of reducing the color viewing angle distance of white light (white $\Delta u'v'$).

Aspects of the present disclosure are not limited to the above-mentioned aspect. Other aspects and advantages may be described below or may be understood by those skilled in the art from the following description from the description.

According to an aspect of the present disclosure, there is provided an OLED device including: a red organic light-emitting diode comprising a red organic emission layer; a green organic light-emitting diode comprising a green organic emission layer; and a blue organic light-emitting diode comprising a blue organic emission layer. The difference ($\Delta LR$) between a peak of a photoluminescence (PL) spectrum of the red organic emission layer ($R\_PL\lambda_{max}$) and a peak of an electroluminescence (EL) spectrum of the red organic light-emitting diode ($R\_EL\lambda_{max}$) is less than 2 nm, the difference ($\Delta LG$) between a peak of a photoluminescence PL spectrum of the green organic emission layer ($G\_PL\lambda_{max}$) and a peak of an electroluminescence EL spectrum of the green organic light-emitting diode ($G\_EL\lambda_{max}$) is less than 2 nm, and the difference ($\Delta LB$) between a peak of a PL spectrum of the blue organic emission layer ($B\_PL\lambda_{max}$) and a peak of an EL spectrum of the blue organic light-emitting diode ($B\_EL\lambda_{max}$) is 4 nm or greater.

Particulars in the exemplary embodiments of the present disclosure will be described in the detail description with reference to the accompanying drawings.

According to exemplary embodiment(s) of the present disclosure, an OLED device can reduce the color viewing angle distance of the white light (white Δu'v') by increasing the color viewing angle distance of blue light (blue Δu'v').

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Figure 1:
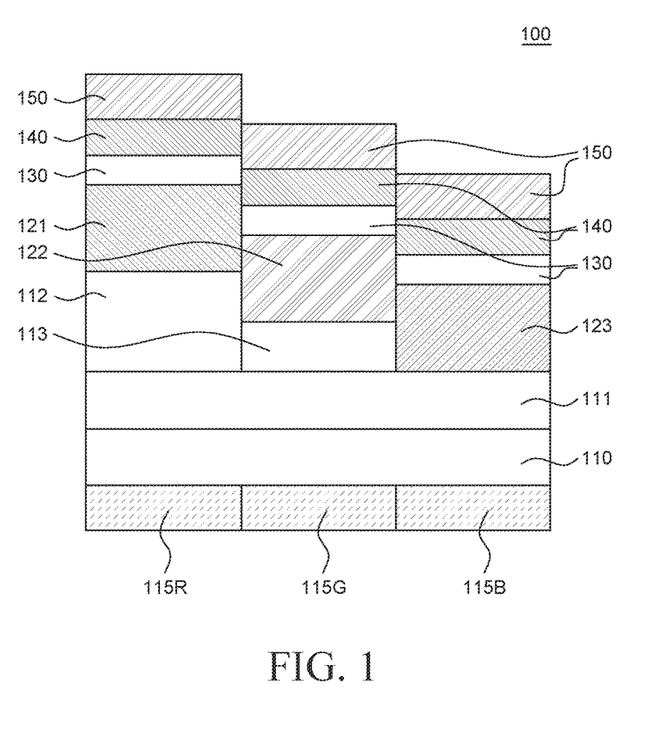
FIG. 1 is an organic light-emitting display (OLED) device according to an embodiment of the present disclosure.

FIG. 1 is an organic light-emitting display (OLED) device according to an embodiment of the present disclosure.

Referring to FIG. 1, in an OLED device 100 according to an exemplary embodiment of the present disclosure, sub-pixels include red sub-pixel, green sub-pixel, and blue sub-pixel for displaying three primary colors. Each pixel is comprised of a plurality of sub-pixels and additional sub-pixels of other and/or alternative colors may also be implemented, such as white sub-pixels. However, the following description will only focus on pixels with red, green and blue sub-pixels for the sake of explanation only.

Each of the sub-pixels of the OLED device 100 includes an organic light-emitting diode, a thin-film transistor for driving the organic light-emitting diode, and a capacitor for storing image signal. The sub-pixels of the OLED device are arranged in a matrix and are configured to display images. In addition, in order to drive a plurality of pixels, at least data lines, gate lines, and a VDD line are formed. In the OLED device 100, a plurality of sub-pixels and the lines are formed on a substrate made of glass, plastic or metal.

A red sub-pixel includes a red organic light-emitting diode, a driving transistor for driving the red organic light-emitting diode, and a capacitor. A green sub-pixel includes a green organic light-emitting diode, a driving transistor for driving the green organic light-emitting diode, and a capacitor. A blue sub-pixel includes a blue organic light-emitting diode, a driving transistor for driving the blue organic light-emitting diode, and a capacitor.

The red organic light-emitting diode emits red light and has a first anode electrode 115R, a hole injection layer 110, a hole transport layer 111, a red hole transport layer 112, a red organic emission layer 121, an electron transport layer 130, a transflective cathode electrode 140, and a capping layer 150 stacked one on another in this order. One or more of these layers may be combined or implemented together. In other words, at least one functionality can be implemented in another layer such that a particular layer serves a dual purpose.

The green organic light-emitting diode emits green light and has a second anode electrode 115G, a hole injection layer 110, a hole transport layer 111, a green hole transport layer 113, a green organic emission layer 122, an electron transport layer 130, a transflective cathode electrode 140, and a capping layer 150 stacked one on another in this order. One or more of these layers may be combined or implemented together. In other words, at least one functionality can be implemented in another layer such that a particular layer serves a dual purpose.

The blue organic light-emitting diode emits blue light and has a third anode electrode 115B, a hole injection layer 110, a hole transport layer 111, a blue organic emission layer 123, an electron transport layer 130, a transflective cathode electrode 140, and a capping layer 150 stacked one on another in this order. One or more of these layers may be combined or implemented together. In other words, at least one functionality can be implemented in another layer such that a particular layer serves a dual purpose.

Although not shown in FIG. 1, a bank may be disposed between every two of the red organic light-emitting diode, the green organic light-emitting diode and the blue organic light-emitting diode, in order to separate the sub-pixels from one another.

Each of the anode electrodes has reflective property.

White light may refer to a mixture of red light, green light and blue light. White light may be generated by applying signals appropriately to the red, green and blue organic light-emitting diodes. For example, white light may be generated by applying a red image signal, a green image signal, and a blue image signal at the maximum gradation to red, green and blue organic light-emitting diodes, respectively.

The red organic emission layer 121 has a photoluminescence (PL) spectrum based on a host and/or dopant contained in the red organic emission layer 121. A wavelength ($\lambda$) having the highest intensity in the photoluminescence PL spectrum of the red organic emission layer 121 is defined as the PL peak (R_PL$\lambda_{max}$) of the red organic emission layer.

The green organic emission layer 122 has a PL spectrum based on a host and/or dopant contained in the green emission layer 122. A wavelength ($\lambda$) having the highest intensity in the PL spectrum of the green organic emission layer 122 is defined as PL peak (G_PL$\lambda_{max}$) of the green organic emission layer.

The blue organic emission layer 123 has a PL spectrum based on a host and/or dopant contained in the blue emission layer 123. A wavelength ($\lambda$) having the highest intensity in the PL spectrum of the blue organic emission layer 123 is defined as PL peak (B_PL$\lambda_{max}$) of the blue organic emission layer.

Each of the organic light-emitting diodes has an optical distance. For example, the optical distance of the red organic light-emitting diode is defined as the distance from the top of the first anode electrode 115R to the bottom of the transflective cathode electrode 140. The optical distance of the green organic light-emitting diode is defined as the distance from the top of the second anode electrode 115G to the bottom of the transflective cathode electrode 140. The optical distance of the blue organic light-emitting diode is defined as the distance from the top of the third anode electrode 115B to the bottom of the transflective cathode electrode 140.

The optical distance of each of the organic light-emitting diodes may be adjusted (or varied) by at least one hole transport layer. For example, the optical distance of the red organic light-emitting diode may be adjusted (or varied) by the red hole transport layer 112. For example, the optical distance of the green organic light-emitting diode may be adjusted (or varied) by the green hole transport layer 113. For example, the optical distance of the blue organic light-emitting diode may be adjusted (or varied) by the hole transport layer 111. However, this is merely illustrative and is not limiting. The optical distance of the organic light-emitting diodes may be adjusted (or varied) by other layer(s).

As the thickness of the common layer varies, the optical distance of each of the red organic light-emitting diode, the green organic light-emitting diode and the blue organic light-emitting diode varies. The common layer refers to a layer shared by the red organic light-emitting diode, the green organic light-emitting diode and the blue organic light-emitting diode.

For example, since the hole transport layer 111 is a common layer, the optical distance of the red organic light-emitting diode and the optical distance of the green organic light-emitting diode may vary by adjusting the thickness of the hole transport layer 111. In this case, the optical distance may be adjusted (or varied) by adjusting the thickness of each of the red hole transport layer 112 and the green hole transport layer 113. Each of the organic light-emitting diodes has an electroluminescence (EL) spectrum which may be determined by micro-cavity effects according to the respective optical distances. That is, the PL spectrum of the light emitted from an organic emission layer is different from the EL spectrum of the light emitted from an organic light-emitting diode including the organic emission layer.

A wavelength ($\lambda$) having the highest intensity in the EL spectrum of the red organic light-emitting diode is defined as the EL peak (R_EL$\lambda_{max}$) of the red organic light-emitting diode. The difference ($\Delta$LR) between the PL peak (R_PL$\lambda_{max}$) and the EL peak (R_EL$\lambda_{max}$) of the red organic light-emitting diode may be denoted by $\Delta$LR. In this case, the reference viewing angle is 0°.

A wavelength ($\lambda$) having the highest intensity in the EL spectrum of the green organic light-emitting diode is defined as the EL peak (G_EL$\lambda_{max}$) of the green organic light-emitting diode. The difference ($\Delta$LG) between the PL peak (G_PL$\lambda_{max}$) and the EL peak (G_EL$\lambda_{max}$) of the green organic light-emitting diode may be denoted by $\Delta$LG. In this case, the reference viewing angle is 0°.

A wavelength ($\lambda$) having the highest intensity in the EL spectrum of the blue organic light-emitting diode is defined as the EL peak (B_EL$\lambda_{max}$) of the blue organic light-emitting diode. The difference (ΔLB) between the PL peak (B_PL$\lambda_{max}$) and the EL peak (B_EL$\lambda_{max}$) of the blue organic light-emitting diode may be denoted by ΔLB. In this case, the reference viewing angle is 0°.

Figure 2:
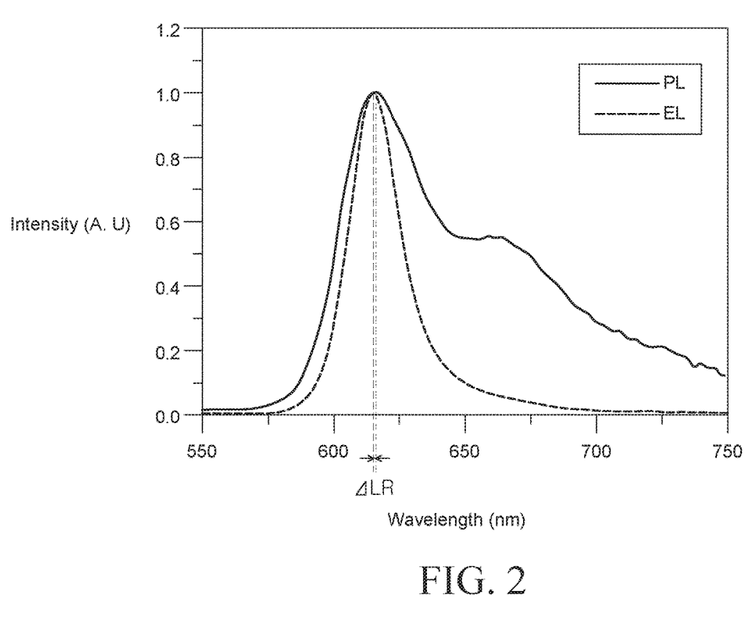
FIG. 2 is a graph showing a photoluminescence (PL) spectrum, an electroluminescence (EL) spectrum and a difference (ΔLR) between PL peak and EL peak of a red organic light-emitting diode according to an exemplary embodiment of the present disclosure.
Figure 3:
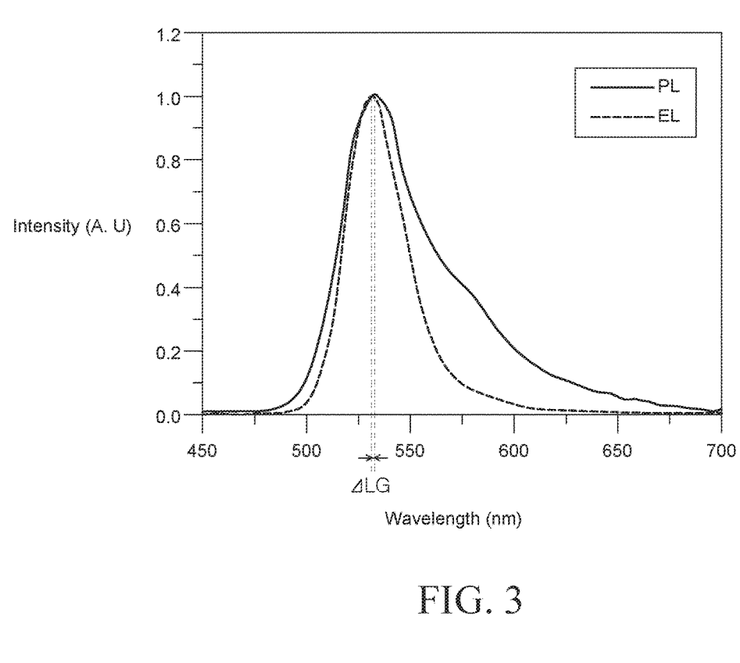
FIG. 3 is a graph showing a PL spectrum, an EL spectrum and a difference (ΔLG) between the PL peak and the EL peak of a green organic light-emitting diode according to an exemplary embodiment of the present disclosure.
Figure 4:
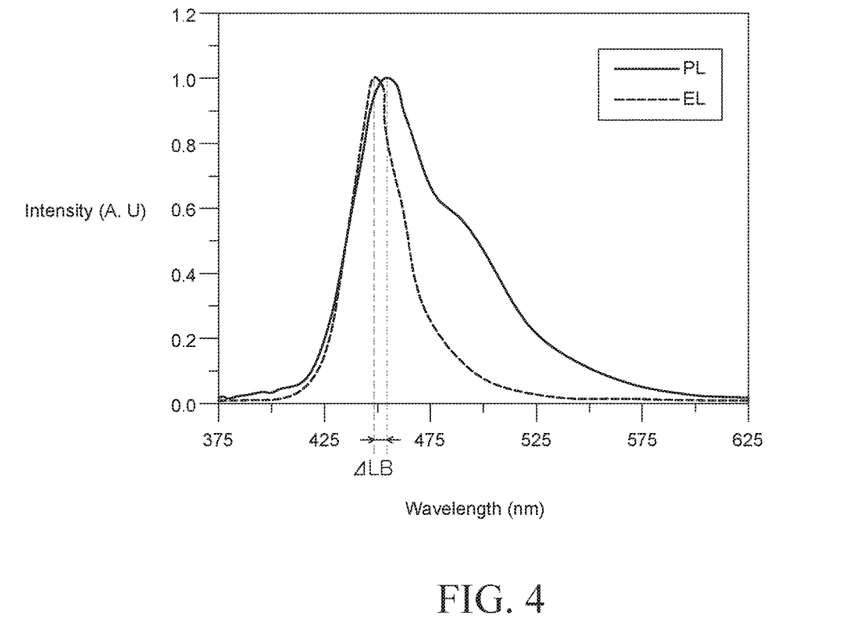
FIG. 4 is a graph showing a PL spectrum, an EL spectrum and a difference (ΔLB) between PL peak and EL peak of a blue organic light-emitting diode according to an exemplary embodiment of the present disclosure.

FIGS. 2 to 4 are graphs showing PL spectrums and EL spectrums of organic light-emitting diodes of an organic light-emitting display (OLED) device 100 according to an exemplary embodiment of the present disclosure. These graphs are showing out-coupling curve. The out-coupling curve can be moved to a short wavelength as changing of the viewing angles. The moving degree of the out-coupling curve may be varied depending on the optical length of the organic light-emitting diodes. To be explained below, the out-coupling curve may be based on that reference viewing angle is 0°.

FIG. 2 is a graph showing a PL spectrum, an EL spectrum and a difference (ΔLR) between the PL peak and the EL peak of a red organic light-emitting diode according to an exemplary embodiment of the present disclosure. FIG. 3 is a graph showing a PL spectrum, an EL spectrum and a difference (ΔLG) between the PL peak and the EL peak of a green organic light-emitting diode according to an exemplary embodiment of the present disclosure. FIG. 4 is a graph showing a PL spectrum, an EL spectrum and a difference (ΔLB) between the PL peak and the EL peak of a blue organic light-emitting diode according to an exemplary embodiment of the present disclosure.

In the OLED device 100 according to an exemplary embodiment of the present disclosure, ΔLR is less than 2 nm, ΔLG is less than 2 nm, and ΔLB is 4 nm or greater.

The difference between the PL peak (PL$\lambda_{max}$) and the EL peak (EL$\lambda_{max}$) may achieved by adjusting the optical distance of each of the organic light-emitting diodes. However, this is merely illustrative and is not limiting.

For example, the optical distance of the blue organic light-emitting diode may be adjusted (or varied) so that the difference (ΔLB) between the PL peak of the blue organic emission layer (B_PL$\lambda_{max}$) and the EL peak of the organic light-emitting diode (B_EL$\lambda_{max}$) is 4 nm or greater.

For example, to meet the above-mentioned condition of ΔLR<2 nm, the optical distance of the red organic light-emitting diode may be the half of the PL peak of the red organic emission layer (R_PL$\lambda_{max}$). However, this is merely illustrative and is not limiting. For example, if the PL peak of the red organic emission layer (R_PL$\lambda_{max}$) is 620 nm, the optical distance may be 3,100 Å, which is the half of the PL peak of the red organic emission layer (R_PL$\lambda_{max}$). On the other hand, the EL peak of the red organic light-emitting diode (R_EL$\lambda_{max}$) may be further affected by the transmittance ratio and thickness of the transflective cathode electrode 140, and also affected slightly by the materials of other common layers. Therefore, in order to meet the condition of ΔLR<2 nm, other factors than the optical distances may also be taken into account.

For example, to meet the above-mentioned condition of ΔLG<2 nm, the optical distance of the green organic light-emitting diode may be the half of the PL peak of the green organic emission layer (G_PL$\lambda_{max}$). However, this is merely illustrative and it not limiting. For example, if the PL peak of the green organic emission layer (G_PL$\lambda_{max}$) is 530 nm, the optical distance may be 2,650 Å, which is the half of the PL peak of the green organic emission layer (G_PL$\lambda_{max}$). However, the EL peak of the green organic light-emitting diode (G_EL$\lambda_{max}$) may be further slightly affected by the transmittance ratio and thickness of the transflective cathode electrode 140, and also affected slightly by the materials of other common layers. Therefore, in order to meet the condition of ΔLG<2 nm, other factors than the optical distances may also be taken into account.

For example, to meet the above-mentioned condition of ΔLB≥4 nm, the optical distance of the blue organic light-emitting diode may be the half of the PL peak of the blue organic emission layer (B_PL$\lambda_{max}$). However, this is merely illustrative and is not limiting.

Specifically, in order to obtain a micro-cavity effects according to the optical distance (d), the optical distance (d) is determined by a formula, 2nd=mλ. (n: refractive index of the medium, m: order, λ: wavelength). If the wavelength of the formula is PL peak, the optical distance may be the half of the PL peak according to the formula, d=mλ/2.

For example, if the PL peak of the blue organic emission layer (B_PL$\lambda_{max}$) is 460 nm, the optical distance may be 2300 Å. Taking into account the difference (ΔLB) between the PL peak of the blue organic emission layer (B_PL$\lambda_{max}$) and the EL peak of the organic light-emitting diode (B_EL$\lambda_{max}$), the optical distance may be adjusted (or varied) in order to meet ΔLB≥4 nm.

If the EL peak of the blue organic light-emitting diode (B_EL$\lambda_{max}$) is 456 nm taking into account the condition of ΔLB≥4 nm, the optical distance may be 2,260 Å. That is, in order to meet ΔLB≥4 nm, the optical distance may be adjusted (or varied) by more than specific value. For example, the optical distance may be adjusted (or varied) by more than 40 Å. If out-coupling curve can be moved to a short wavelength as changing of the viewing angles in the optical distance, the difference (ΔLB) between the PL peak of the blue organic emission layer (B_PL$\lambda_{max}$) and the EL peak of the organic light-emitting diode (B_EL$\lambda_{max}$) may be met 4 nm or greater.

Accordingly, as the color viewing angle distance of the blue light (blue Δu'v') emitting from the blue organic emission layer 123 becomes higher in the condition of ΔLB≥4 nm, the color viewing angle distance of the white light (white Δu'v') emitting from the OLED device becomes lower. In particular, it can be said that the image quality of an OLED device may be better as the color viewing angle distance of white light (white Δu'v') is lower. In case of that the condition of ΔLB≥4 nm, the image quality of an OLED device may be better The optical distance is not limited to 40 Å and may be adjusted (or varied) by more than or less than 40 Å. The optical distance may be adjusted (or varied) by the hole transport layer 111. However, this is not limiting, the optical distance of the organic light-emitting diodes may be adjusted (or varied) by other layer(s).

However, the EL peak of the blue organic light-emitting diode (B_EL$\lambda_{max}$) may be further slightly affected by the transmittance ratio and thickness of the transflective cathode electrode 140, and also affected slightly by the materials of other common layers. Therefore, in order to meet the condition of ΔLB≥4 nm, other factors than the optical distances may also be taken into account.

However, this is merely illustrative and the difference (ΔLB) may be 8 nm or less. In particular, if the difference (ΔLB) is 8 nm or greater, the color viewing angle distance of the blue light (blue Δu'v') emitting from the blue organic emission layer 123 becomes higher than specific value. According to that, blue light becomes relatively stronger than any other lights in the white light, the color viewing angle distance of the white light (white Δu'v') becomes higher than specific value. In particular, it can be said that the image quality of an OLED device is better as the color viewing angle distance of white light (white Δu'v') is lower.

In case of that the condition of ΔLB≥8 nm, the image quality of an OLED device may be degraded.

Consequently, the optical distance of the organic light-emitting diodes may be adjusted (or varied) in that condition of 8 nm≥ΔLB≥4 nm. Accordingly, it is desirable that the optical distance of the red organic light-emitting diode is about 2400 Å~2600 Å, the optical distance of the green organic light-emitting diode is about 2100 Å~2300 Å, and the optical distance of the blue organic light-emitting diode is about 1500 Å~1700 Å.

A micro-cavity is formed based on the determined optical distances. By virtue of the micro-cavity, the intensity of some visible wavelength bands is increased, and the intensity of other visible wavelength bands is decreased.

FIGS. 5 to 9 are views for comparing an OLED device according to a comparative example with an OLED device 100 according to an exemplary embodiment of the present disclosure.

Figure 5:
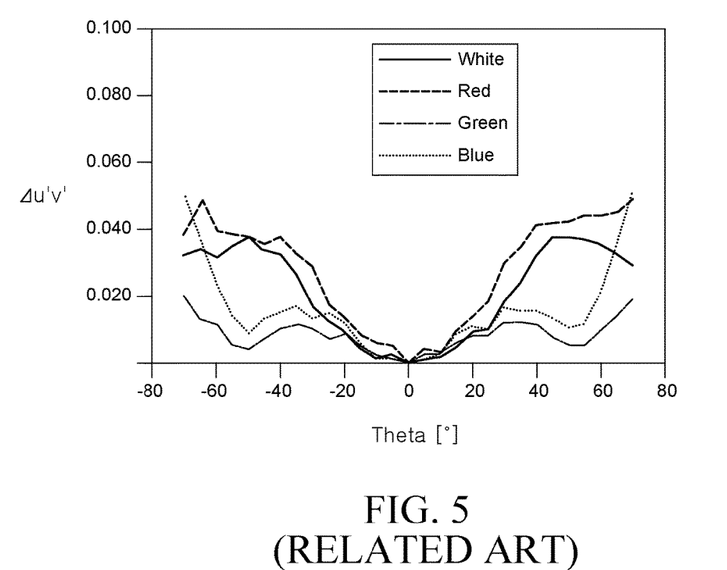
FIG. 5 is a graph showing color viewing angle distances (Δu'v') at different viewing angles of the OLED device according to a comparative example.
Figure 6:
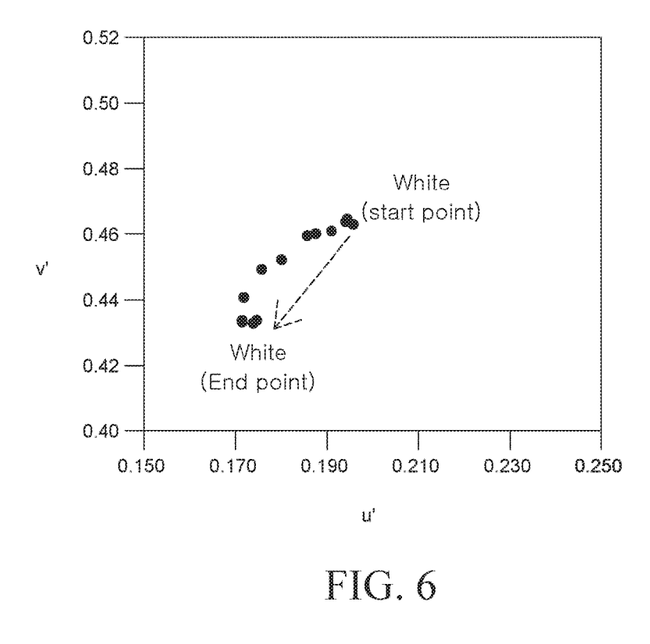
FIG. 6 is a CIELu'v' color space for illustrating color viewing angle distances (Δu'v') at different viewing angles of the OLED device according to a comparative example.
Figure 7:
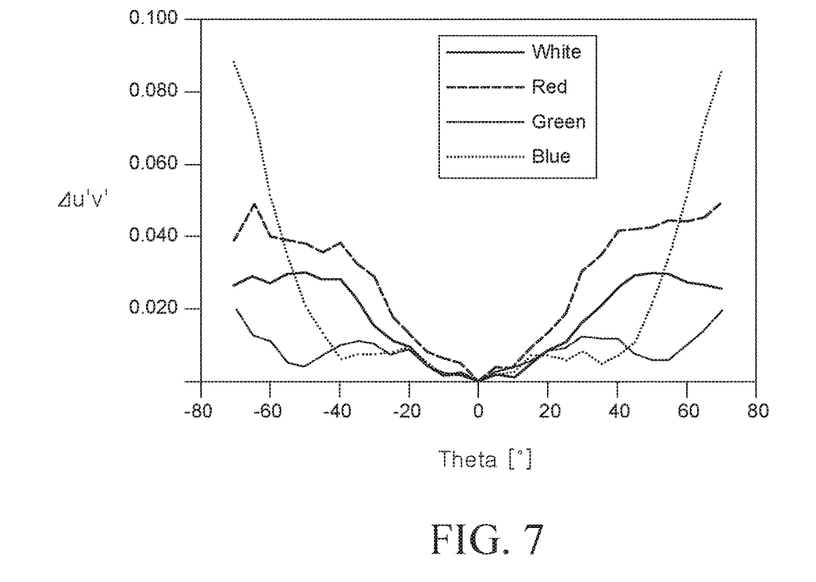
FIG. 7 is a graph showing color viewing angle distances (Δu'v') at different viewing angles of the OLED device according to the exemplary embodiment of the present disclosure.
Figure 8:
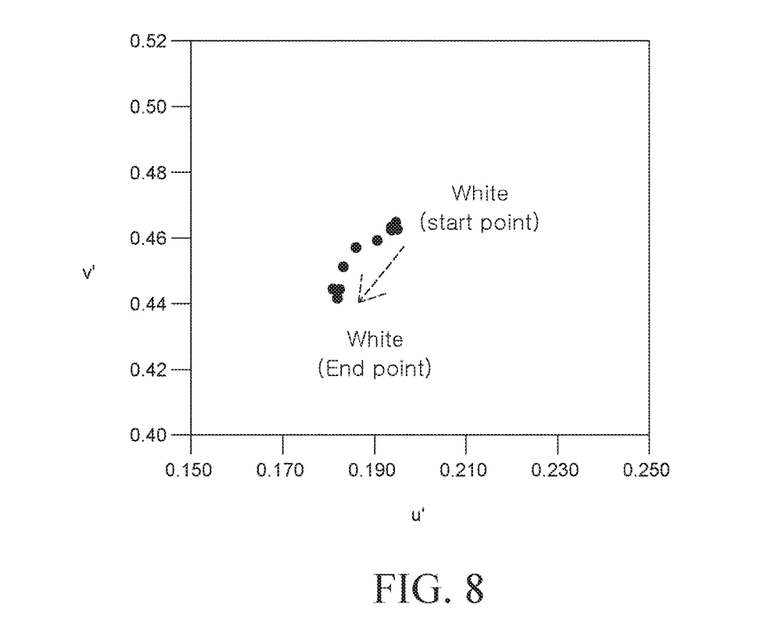
FIG. 8 is a CIELu'v' color space for illustrating color viewing angle distances (Δu'v') at different viewing angles of the OLED device according to the exemplary embodiment of the present disclosure.
Figure 9:
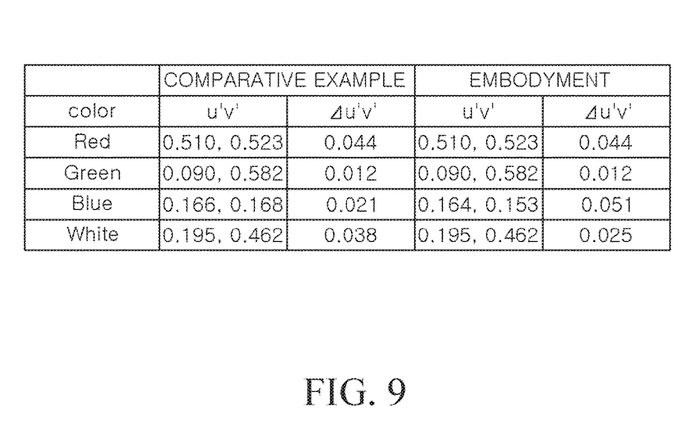
FIG. 9 is a table for comparing the color coordinates (u'v') measured at the viewing angle of 0° and the color viewing angle distance measured at the viewing angle of 60° (Δu'v'@0° to 60°) of the OLED device according to a comparative example with those of the OLED device according to the exemplary embodiment of the present disclosure.

FIG. 5 is a graph showing color viewing angle distances (Δu'v') at different viewing angles of the OLED device according to Comparative Example. FIG. 6 is a CIELu'v' color space for illustrating color viewing angle distances (Δu'v') at different viewing angles of the OLED device according to Comparative Example. FIG. 7 is a graph showing color viewing angle distances (Δu'v') at different viewing angles of the OLED device according to the exemplary embodiment of the present disclosure. FIG. 8 is a CIELu'v' color space for illustrating color viewing angle distances (Δu'v') at different viewing angles of the OLED device according to the exemplary embodiment(s) of the present disclosure. FIG. 9 is a table for comparing the color coordinates measured at the viewing angle of 0° (u'v'@0° and the color viewing angle distance measured at the viewing angle of 60° (Δu'v'@0° to 60°) of the OLED device according to the comparative example with those of the OLED device according to the exemplary embodiment of the present disclosure.

Referring to FIGS. 5 and 7, the red organic light-emitting diode and the blue organic light-emitting diode according to the comparative example have substantially the same configuration as those according to the exemplary embodiment of the present disclosure, and thus they have the same color viewing angle distances. In addition, the blue organic light-emitting diode according to the comparative example is in the condition of ΔLB<2 nm, like other typical organic light-emitting diodes.

The reference angle of the viewing angles may be 0°. This is because it is typical that the OLED device 100 has the best image quality at the viewing angle of 0° when viewers watch the OLED device. The viewing angle of 60° is significant to determine image quality according to color viewing angle distance (Δu'v'), because it is typical that the largest viewing angle is 60° when viewers watch the OLED device. Accordingly, in the following description, the color viewing angle distance Δu'v' is measured from 0°. However, this is merely illustrative and the largest angle may have different values, e.g., 70°, for example. The reference angle is 0° unless specifically mentioned otherwise.

Referring to FIG. 5, in the OLED device according to the comparative example, the color viewing angle distance of white light at the viewing angle of 0° (white Δu'v'@0°) is 0. Further, the color viewing angle distance of white light at the viewing angle of 60° (white Δu'v'@0° to 60°) is 0.038.

In the OLED device according to the comparative example, the color viewing angle distance of blue light at the viewing angle of 0° (blue Δu'v'@0°) is 0. Further, the color viewing angle distance of blue light at the viewing angle of 60° (blue Δu'v'@0° to 60°) is 0.021.

FIG. 6 shows the distribution characteristics of the measured color coordinates (u'v') at viewing angles from 0° to 70° according to the comparative example. The start point corresponds to 0°, and the end point corresponds to 70°.

Referring to FIG. 7, in the OLED device 100 according to the exemplary embodiment(s) of the present disclosure, the color viewing angle distance of white light at the viewing angle of 0° (white Δu'v'@0°) is 0. Further, the color viewing angle distance of white light at the viewing angle of 60° (white Δu'v'@0° to 60°) is 0.025.

In the OLED device 100 according to the exemplary embodiment(s) of the present disclosure, the color viewing angle distance of blue light at the viewing angle of 0° (blue Δu'v'@0° is 0. Further, the color viewing angle distance of blue light at the viewing angle of 60° (blue Δu'v'@0° to 60°) is 0.051.

It is to be noted that the value of 0.051 is merely a measured value in an example. If the difference (ΔLB) between the PL peak ($B\_PL\lambda_{max}$) and EL peak ($B\_EL\lambda_{max}$) of the blue organic light-emitting diode is 4 nm or greater, the color viewing angle distance of blue light (blue Δu'v'@0° to 60°) may be 0.032 or greater.

FIG. 8 shows the distribution characteristics of the color coordinates of white light (white u'v') at viewing angles from 0° to 70° in the OLED device 100 according to the exemplary embodiment of the present disclosure. The start point corresponds to 0°, and the end point corresponds to 70°.

That is, the color viewing angle distance of white light (white Δu'v'@0° to 60°) was decreased to 0.025 from 0.038. In addition, the color viewing angle distance of blue light (blue Δu'v'@0° to 60°) was increased to 0.051 from 0.021.

The table shown in FIG. 9 compares the color coordinates measured at the viewing angle of 0° (u'v'@0°) and the color viewing angle distance measured at the viewing angle of 60° (Δu'v'@0° to 60°) of the OLED device according to the comparative example with those of the OLED device according to the exemplary embodiment of the present disclosure.

Referring to FIG. 9, the color viewing angle distance of white light (white Δu'v') is lower in the exemplary embodiment of the present disclosure than in the comparative example even though the viewing angle is increased.

Accordingly, as the viewing angle of the OLED device 100 according to the exemplary embodiment of the present disclosure is increased, the color viewing angle distance of the blue light (blue Δu'v') becomes higher generally in the exemplary embodiment of the present disclosure than in Comparative Example, but the color viewing angle distance of the white light (white Δu'v') becomes lower in the exemplary embodiment of the present disclosure than in Comparative Example. In particular, it can be said that the image quality of an OLED device is better as the color viewing angle distance of white light (white Δu'v') is lower. Accordingly, the OLED device 100 according to the exemplary embodiment of the present disclosure has advantages in that it can exhibit better image quality at various viewing angles than Comparative Example.

The exemplary embodiments of the present disclosure can also be described as follows:

According to an aspect of the present disclosure, an OLED device includes: a red organic light-emitting diode comprising a red organic emission layer; a green organic light-emitting diode comprising a green organic emission layer; and a blue organic light-emitting diode comprising a blue organic emission layer. The difference (ΔLR) between a peak of a photoluminescence (PL) spectrum of the red organic emission layer (R_PL$\lambda_{max}$) and a peak of an electroluminescence (EL) spectrum of the red organic light-emitting diode (R_EL$\lambda_{max}$) is less than 2 nm, the difference (ΔLG) between a peak of a PL spectrum of the green organic emission layer (G_PL$\lambda_{max}$) and a peak of an EL spectrum of the green organic light-emitting diode (G_EL$\lambda_{max}$) is less than 2 nm, and the difference (ΔLB) between a peak of a PL spectrum of the blue organic emission layer (B_PL$\lambda_{max}$) and a peak of an EL spectrum of the blue organic light-emitting diode (B_EL$\lambda_{max}$) is 4 nm or greater.

The color viewing angle distance of white light (white Δu'v'@0° to 60°) may be 0.032 or less. The white light may be produced by mixing light emitted from the red organic light-emitting diode, the light emitted from the green organic light-emitting diode and the light emitted from the blue organic light-emitting diode.

Each of the red organic light-emitting diode, the green organic light-emitting diode and the blue organic light-emitting diode may include: a hole injection layer; a hole transport layer on the hole injection layer; an electron transport layer on the hole transport layer; a transflective cathode electrode on the electron transport layer; and a capping layer on the cathode electrode.

The blue organic light-emitting diode may further include a third anode electrode, wherein the third anode electrode, the hole injection layer, the hole transport layer, the blue organic emission layer, the electron transport layer, the transflective cathode electrode and the capping layer are stacked one on another in this order, and wherein an optical distance of the blue organic light-emitting diode is defined as a distance between a top surface of the third anode electrode and a bottom surface of the transflective cathode electrode.

The green organic light-emitting diode may further include a second anode electrode. The second anode electrode, the hole injection layer, the hole transport layer, the green hole transport layer, the green organic emission layer, the electron transport layer, the transflective cathode electrode and the capping layer are stacked one on another in this order. The optical distance of the blue organic light-emitting diode may be defined as a distance between a top surface of the third anode electrode and a bottom surface of the transflective cathode electrode.

The red organic light-emitting diode may further include a first anode electrode and a red hole transport layer. The first anode electrode, the hole injection layer, the hole transport layer, the red hole transport layer, the red organic emission layer, the electron transport layer, the transflective cathode electrode and the capping layer are stacked one on another in this order. The optical distance of the red organic light-emitting diode may be defined as a distance between a top surface of the first anode electrode and a bottom surface of the transflective cathode electrode.

The color viewing angle distance of the blue organic light-emitting diode (blue Δu'v'@0° to 60°) may be 0.032 or greater The color viewing angle distance of the blue organic light-emitting diode (blue Δu'v'@0° to 60°) may be 0.051 or greater.

The color viewing angle distance of the blue organic light-emitting diode (blue Δu'v'@0° to 60°) may be greater than the color viewing angle distance of the green organic light-emitting diode (green Δu'v'@0° to 60°).

The color viewing angle distance of the blue organic light-emitting diode (blue Δu'v'@0° to 60°) may be greater than the color viewing angle distance of the red organic light-emitting diode (red Δu'v'@0° to 60°).

The difference (ΔLB) between the PL peak (B_PL$\lambda_{max}$) of the blue organic emission layer and the EL peak (B_EL$\lambda_{max}$) of the blue organic light-emitting diode may be 8 nm or less.

The optical distance of the blue organic light-emitting diode may be adjusted so that the difference (ΔLB) between the PL peak of the blue organic emission layer (B_PL$\lambda_{max}$) and the EL peak of the organic light-emitting diode (B_EL$\lambda_{max}$) may be 4 nm or greater.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. An organic light-emitting display (OLED) device, comprising:
   a red organic light-emitting diode having a first optical distance;
   a green organic light-emitting diode having a second optical distance that is shorter than the first optical distance; and
   a blue organic light-emitting diode having a third optical distance that is shorter than the second optical distance;
   wherein a color viewing angle distance of blue light (blue Δu'v'@0° to 60°) is greater than a color viewing angle distance of red light (red Δu'v'@0° to 60°) and a color viewing angle distance of green light (green Δu'v'@0° to 60°), respectively, and
   wherein a color viewing angle distance of white light (white Δu'v'@0° to 60°) is less than the color viewing angle distance of blue light (blue Δu'v'@0° to 60°).

2. The OLED device of claim 1, wherein the color viewing angle distance of white light (white Δu'v'@0° to 60°) is 0.032 or less, and the color viewing angle distance of blue light (blue Δu'v'@0° to 60°) is greater than 0.032.

3. The OLED device of claim 2, wherein a difference (ΔLB) between a peak of a photoluminescence (PL) spectrum of a blue organic emission layer (B_PL$\lambda_{max}$) and a peak of an electroluminescence (EL) spectrum of the blue organic light-emitting diode (B_EL$\lambda_{max}$) is greater than a difference (ΔLG) between a peak of a photoluminescence (PL) spectrum of a green organic emission layer (G_PL$\lambda_{max}$) and a peak of an electroluminescence (EL) spectrum of the green organic light-emitting diode (G_EL$\lambda_{max}$).

4. The OLED device of claim 3, wherein the difference (ΔLB) between the peak of the photoluminescence (PL) spectrum of the blue organic emission layer (B_PL$\lambda_{max}$) and the peak of an electroluminescence (EL) spectrum of the blue organic light-emitting diode (B_EL$\lambda_{max}$) is greater than a difference (ΔLR) between a peak of a photoluminescence (PL) spectrum of a red organic emission layer (R_PL$\lambda_{max}$) and a peak of an electroluminescence (EL) spectrum of the red organic light-emitting diode (R_EL$\lambda_{max}$).

5. The OLED device of claim 4,
   wherein the difference (ΔLB) between the peak of the photoluminescence (PL) spectrum of the blue organic emission layer (B_PL$\lambda_{max}$) and the peak of the electroluminescence (EL) spectrum of the blue organic light-emitting diode ($B\_EL\lambda_{max}$) is between 4 nm and 8 nm,
wherein the difference ($\Delta LG$) between the peak of the photoluminescence (PL) spectrum of the green organic emission layer ($G\_PL\lambda_{max}$) and the peak of the electroluminescence (EL) spectrum of the green organic light-emitting diode ($G\_EL\lambda_{max}$) is less than 2 nm, and
wherein the difference ($\Delta LR$) between the peak of the photoluminescence (PL) spectrum of the red organic emission layer ($R\_PL\lambda_{max}$) and the peak of the electroluminescence (EL) spectrum of the red organic light-emitting diode ($R\_EL\lambda_{max}$) is less than 2 nm.

6. The OLED device of claim 1, wherein the OLED device is configured to reduce the color viewing angle distance of white light (white $\Delta u'v'@0°$ to 60°) by increasing the color viewing angle distance of blue light (blue $\Delta u'v'@0°$ to 60°) to be larger than the color viewing angle distance of white light (white $\Delta u'v'@0°$ to 60°).

7. The OLED device of claim 6, wherein the color viewing angle distance of blue light (blue $\Delta u'v'@0°$ to 60°) is determined to be the largest among the color viewing angle distances of red light (red $\Delta u'v'@0°$ to 60°), green light (green $\Delta u'v'@0°$ to) 60°, blue light (blue $\Delta u'v'@0°$ to 60°), and white light (white $\Delta u'v'@0°$ to 60°).

8. The OLED device of claim 1, wherein the third optical distance is adjusted by more than 40 Å from a half of the peak of the photoluminescence (PL) spectrum of the blue organic emission layer ($B\_PL\lambda_{max}$) of the blue organic light-emitting diode.

9. The OLED device of claim 8, wherein the difference ($\Delta LB$) between the peak of the photoluminescence (PL) spectrum of the blue organic emission layer ($B\_PL\lambda_{max}$) and the peak of an electroluminescence (EL) spectrum of the blue organic light-emitting diode ($B\_EL\lambda_{max}$) is more than 4 nm.

10. The OLED device of claim 3, further comprising:
a common hole transport layer with respect to the red, green and blue organic light-emitting diodes, a red hole transport layer between the common hole transport layer and the red organic emission layer, and a green hole transport layer between the common hole transport layer and the green organic emission layer,
wherein the first optical distance is adjusted by a thickness of the common hole transport layer and a thickness of the red hole transport layer,
wherein the difference ($\Delta LR$) between the peak of the photoluminescence (PL) spectrum of the red organic emission layer ($R\_PL\lambda_{max}$) and the peak of the electroluminescence (EL) spectrum of the red organic light-emitting diode ($R\_EL\lambda_{max}$) is less than 2 nm,
wherein the second optical distance is adjusted by the thickness of the common hole transport layer and a thickness of the green hole transport layer,
wherein the difference ($\Delta LG$) between the peak of the photoluminescence (PL) spectrum of the green organic emission layer ($G\_PL\lambda_{max}$) and the peak of the electroluminescence (EL) spectrum of the green organic light-emitting diode ($G\_EL\lambda_{max}$) is less than 2 nm, and
wherein the third optical distance is adjusted by the thickness of the common hole transport layer,
wherein the difference ($\Delta LB$) between the peak of the photoluminescence (PL) spectrum of the blue organic emission layer ($B\_PL\lambda_{max}$) and the peak of the electroluminescence (EL) spectrum of the blue organic light-emitting diode ($B\_EL\lambda_{max}$) is between 4 nm and 8 nm.

11. An organic light-emitting display (OLED) device, comprising:
a red organic light-emitting diode having a first optical distance comprising:
a first anode electrode;
a red organic emission layer on the first anode electrode; and
a cathode electrode on the red organic emission layer;
a green organic light-emitting diode having a second optical distance shorter than the first optical distance comprising:
a second anode electrode;
a green organic emission layer on the second anode electrode; and
the cathode electrode on the green organic emission layer; and
a blue organic light-emitting diode having a third optical distance shorter than the second optical distance comprising:
a third anode electrode;
a blue organic emission layer on the third anode electrode; and
the cathode electrode on the blue organic emission layer;
wherein the first optical distance is a distance between a top surface of the first anode electrode and a bottom surface of the cathode electrode, the first optical distance is determined by a half of a value of a photoluminescence (PL) spectrum of the red organic emission layer ($R\_PL\lambda_{max}$),
wherein the second optical distance is a distance between a top surface of the second anode electrode and the bottom surface of the cathode electrode, the second optical distance is determined by a half of a value of a PL spectrum of the green organic emission layer ($G\_PL\lambda_{max}$), and
wherein the third optical distance is a distance between a top surface of the third anode electrode and the bottom surface of the cathode electrode, the third optical distance is adjusted more than 40 Å from a half of a value of a peak of a PL spectrum of the blue organic emission layer ($B\_PL\lambda_{max}$),
wherein a difference ($\Delta LB$) between the peak of the PL spectrum of the blue organic emission layer ($B\_PL\lambda_{max}$) and a peak of an EL spectrum of the blue organic light-emitting diode ($B\_EL\lambda_{max}$) is between 4 nm and 8 nm.

12. The OLED device of claim 11, wherein a color viewing angle distance of blue light (blue $\Delta u'v'@0°$ to 60°) is greater than a color viewing angle distance of red light (red $\Delta u'v'@0°$ to 60°) and a color viewing angle distance of green light (green $\Delta u'v'@0°$ to) 60°).

13. The OLED device of claim 12, wherein a color viewing angle distance of white light (white $\Delta u'v'@0°$ to 60°) is lower than the color viewing angle distance of blue light (blue $\Delta u'v'@0°$ to 60°).

14. The OLED device of claim 11, wherein a difference ($\Delta LR$) between the $R\_PL\lambda_{max}$ and a peak of an EL spectrum of the red organic light-emitting diode ($R\_EL\lambda_{max}$) is less than 2 nm and a difference ($\Delta L$) between the $G\_PL\lambda_{max}$ and a peak of an EL spectrum of the green organic light-emitting diode ($G\_EL\lambda_{max}$) is less than 2 nm.

15. The OLED device of claim 12, wherein a color viewing angle distance of blue light (blue $\Delta u'v'@0°$ to 60°)

is increased by the third optical distance so as to decrease a color viewing angle distance of white light (white Δu'v'@0° to 60°).

16. The OLED device of claim 15, further comprising:
a hole transport layer common to the red organic light-emitting diode, the green organic light-emitting diode and the blue organic light-emitting diode so as to adjust the third optical distance;
a red hole transport layer between the hole transport layer and the red organic emission layer so as to adjust the first optical distance; and
a green hole transport layer between the hole transport layer and the green organic emission layer so as to adjust the second optical distance,
wherein a thickness of the hole transport layer is determined so as to determine a value of the ΔLB to be between 4 nm and 8 nm,
wherein a thickness of the red hole transport layer is determined so as to determine a value of the ΔLR to be less than 2 nm in consideration of the thickness of the hole transport layer, and
wherein a thickness of the green hole transport layer is determined so as to determine a value of the ΔLR to be less than 2 nm in consideration of the thickness of the hole transport layer.

17. An organic light-emitting diode (OLED) display comprising:
an array of pixels, each pixel having at least red, green and blue sub-pixels, each sub-pixel respectively having an anode, and a common cathode across all the sub-pixels, and white light being produced upon mixture of lights emitted from the red, green and blue sub-pixels, each sub-pixel having an optical distance defined from a top surface of its anode to a bottom surface of the cathode, the optical distance providing micro-cavity effects that achieve particular color viewing angle characteristics, and
in contrast to a conventional OLED display having conventional red, green and blue sub-pixels with all optical distances being equal to one half of a peak value of its respective photoluminescence (PL) spectrum, each blue sub-pixel has an adjusted optical distance that is not equal one half of the peak value of its PL spectrum to cause a color viewing angle distance of the white light (white Δu'v'@0° to 60°) to be less than a color viewing angle of blue light (blue Δu'v'@0° to 60°) due to the adjusted optical distance of each blue sub-pixel, and the color viewing angle distance of blue light (blue Δu'v'@0° to 60°) is greater than a color viewing angle distance of red light (red Δu'v'@0° to 60°).

18. The OLED device of claim 17,
wherein the adjusted optical distance of each blue sub-pixel is an optical distance adjusted from one half of the peak value of its PL spectrum by more than 40 Å, and
wherein the optical distances of each red and the green sub-pixel are equal to one half of the peak value of its PL spectrum.

19. The OLED device of claim 18, wherein the color viewing angle distance of white light is obtained by vector coordinate measurements of white light (Δu'v') at 0° to 60° and the color viewing angle of blue light is obtained by vector coordinate measurements of blue light (Δu'v') at 0° to 60°.

* * * * *